(12) United States Patent
Huynh

(10) Patent No.: US 8,693,591 B1
(45) Date of Patent: Apr. 8, 2014

(54) APPARATUS AND METHOD FOR TUNING THE FREQUENCY OF A BANDPASS FILTER TO AN OFFSET FREQUENCY AROUND A CARRIER FREQUENCY

(71) Applicant: Phuong Huynh, Fairfax, VA (US)

(72) Inventor: Phuong Huynh, Fairfax, VA (US)

(73) Assignee: Phuong Huynh, Fairfax, VA (US)

( * ) Notice: Subject to any disclaimer, the term of this patent is extended or adjusted under 35 U.S.C. 154(b) by 90 days.

(21) Appl. No.: 13/623,406

(22) Filed: Sep. 20, 2012

(51) Int. Cl.
*H04L 27/06* (2006.01)

(52) U.S. Cl.
USPC .......................................... 375/344; 375/326

(58) Field of Classification Search
USPC ................. 375/316, 343, 344, 345, 326, 327
See application file for complete search history.

(56) References Cited

U.S. PATENT DOCUMENTS

| | | | |
|---|---|---|---|
| 5,418,815 A * | 5/1995 | Ishikawa et al. | 375/216 |
| 5,841,388 A | 11/1998 | Yasuda et al. | |
| 5,953,636 A | 9/1999 | Keate et al. | |
| 6,275,540 B1 | 8/2001 | Barrett, Jr. et al. | |
| 6,731,702 B1 * | 5/2004 | Nomura | 375/343 |
| 7,324,615 B2 | 1/2008 | Lourens et al. | |
| 2003/0021367 A1 | 1/2003 | Smith | |
| 2005/0069056 A1 | 3/2005 | Willingham | |
| 2006/0007929 A1 | 1/2006 | Desai et al. | |
| 2009/0034587 A1 * | 2/2009 | Kobayashi et al. | 375/146 |
| 2013/0083874 A1 * | 4/2013 | de Ruijter et al. | 375/344 |

* cited by examiner

*Primary Examiner* — Emmanuel Bayard

(57) ABSTRACT

A novel frequency locked loop for tuning a bandpass filter to a small offset frequency around an RF center frequency is provided. The difference between the bandpass filter frequency and the RF center frequency is generated, a frequency locked loop is used to tune the frequency difference to a reference offset frequency.

14 Claims, 3 Drawing Sheets

US 8,693,591 B1

APPARATUS AND METHOD FOR TUNING THE FREQUENCY OF A BANDPASS FILTER TO AN OFFSET FREQUENCY AROUND A CARRIER FREQUENCY

FIELD OF THE INVENTION

The present invention relates in general frequency detection, bandpass filter tuning in bandpass delta-sigma analog-to-digital converter, and frequency locked loop

BACKGROUND OF THE INVENTION

Filters have been widely used in many applications. Because of the shortcoming of semiconductor process technology, RF bandpass filters are often implemented by the continuous-time structure. However, component variation over process corners and temperatures requires tuning the center frequency of a bandpass filter to a reference RF frequency.

Current state of the art filter tuning techniques employ a frequency detector and circuits to turn the bandpass filter into an oscillator at the filter frequency. The oscillator frequency is compared to a reference frequency generating an error voltage that corrects the frequency of the oscillator. The oscillator is then disabled and the center frequency of the bandpass filter is tuned to the reference frequency Continuous-time bandpass delta-sigma analog-to-digital converters employ a plurality of resonant stages in a cascade configuration, which are required to have their resonant frequencies spread apart at small offsets frequencies, on the order of a few megahertzs, around an RF center frequency in the gigahertz range. To maintain these resonant frequencies at known fixed frequency offsets about the center frequency dictate a novel frequency tuning technique that is accurate at small delta frequencies.

SUMMARY OF THE INVENTION

It is therefore an object of this invention to provide a circuit and method that can tune a bandpass filter accurately at small frequency offsets around an RF center frequency. This invention features a circuit for tuning a bandpass filter to an offset frequency of an RF frequency, comprising a bandpass filter including a negative resistance oscillator configured to generate an oscillator in-phase clock and an oscillator quadrature clock in response to an oscillator control signal, wherein both the oscillator in-phase clock and the oscillator quadrature clock have an oscillator base frequency; an offset frequency converter configured to generate a bi-level in-phase offset clock and a bi-level quadrature offset clock based on the oscillator in-phase clock, the oscillator quadrature clock, and a first reference clock having a reference base frequency, wherein the bi-level in-phase offset clock and the bi-level quadrature offset clock each has an oscillator offset frequency; a sample/hold configured to sample and hold the bi-level quadrature offset clock using the bi-level in-phase as a sampling clock to generate a side location signal; a frequency detector configured to compare the oscillator offset frequency with a reference offset frequency based on the bi-level in-phase offset clock, the bi-level quadrature offset clock, and a reference offset clock having the reference offset frequency, to generate a direction signal; an inverter configured to invert the direction signal; a NOR gate configured to perform a logical NOR operation on the side location signal and the direction signal to generate a NOR signal; a NAND gate configured to perform a logical NAND operation on the inverted direction signal and the side location signal to generate a NAND signal; a multiplexer configured to output either the NOR signal or the NAND signal as a multiplexer output signal based on a selection signal; a digital controller and memory circuit configured to generate the oscillator control signal based on the multiplexer output signal.

The digital controller and memory is configured such that when the selection signal instructs the multiplexer to output the NOR signal as the multiplexer output signal, the digital controller and memory will generate the oscillator control signal to tune the oscillator frequency to a target frequency equal to the reference base frequency minus the reference offset frequency. Likewise, the digital controller and memory is configured such that when the selection signal instructs the multiplexer to output the NAND signal as the multiplexer output signal, the digital controller and memory will generate the oscillator control signal to tune the oscillator frequency to a target frequency equal to the reference base frequency plus the reference offset frequency.

Furthermore, the frequency offset converter comprises a first mixer configured to mix the oscillator quadrature clock with the reference base clock to generate a first mixed signal; a second mixer configured to mix the oscillator in-phase clock with the reference base clock to generate a second mixed signal; a first low-pass filter configured to filter the first mixed signal to generate a first filtered signal; a second low-pass filter configured to filter the second mixed signal to generate a second filtered signal; a first quantizer configured to quantize the first filtered signal to generate the bi-level quadrature offset clock; and a second quantizer configured to quantize the second filtered signal to generate the bi-level in-phase offset clock.

As an alternative, the frequency offset converter comprises a first sample/hold configured to sample and hold the oscillator quadrature clock using the first reference clock as a first sampling clock; and a second sample/hold configured to sample and hold the oscillator in-phase clock using the first reference clock as a second sampling clock.

The invention also features a method for tuning a bandpass filter to an offset frequency of an RF frequency, comprising receiving an enable signal to instruct the bandpass filter to operate as an oscillator; generating an oscillator in-phase clock and an oscillator quadrature clock, wherein the oscillator in-phase clock and the oscillator quadrature clock each having an oscillator base frequency; generating a quadrature offset clock based on the oscillator quadrature clock and a first reference clock having a reference base frequency; generating an in-phase offset clock based on the in-phase clock and the first reference clock; generating a logical side-location signal based on the in-phase offset clock and the quadrature offset clock; generating a direction signal based on the in-phase offset clock, the quadrature offset clock, and a frequency offset clock having a reference offset frequency; inverting the direction signal; generating a NOR signal by performing a logical NOR operation on the side-location signal; and the direction signal; generating a NAND signal by performing a logical NAND operation on the side-location signal and the inverted direction signal; selecting one of the NAND signal and the NOR signal as a selected signal based on a side-select signal; generating a feedback frequency control signal based on the selected signal; and altering the oscillator frequency based on the feedback frequency control signal.

Furthermore, generating the in-phase offset clock comprises mixing the oscillator in-phase signal with the first reference clock to generate an in-phase mixing signal; performing a low-pass filtering operation on the in-phase mixing signal to generate an in-phase baseband signal; and quantizing the in-phase baseband signal to generate the in-phase offset clock. Also, generating the quadrature offset clock comprises mixing the oscillator quadrature signal with the first reference clock to generate a quadrature mixing signal; performing a low-pass filtering operation on the quadrature mixing signal to generate a quadrature baseband signal; and quantizing the quadrature baseband signal to generate the quadrature offset clock As an alternative, generating the in-phase offset clock comprises sampling and holding the oscillator in-phase clock using the first reference clock as a sampling clock to generate the in-phase offset clock. Likewise, generating the quadrature offset clock comprises sampling and holding the oscillator quadrature clock using the first reference clock as a sampling clock to generate the quadrature offset clock.

Furthermore, generating the logical side-location signal based on the in-phase offset clock and the quadrature offset clock further comprises sampling the quadrature offset clock using the in-phase offset clock as a sampling clock. Also, when the NOR signal is the selected signal, the oscillator frequency is altered to approach a target frequency equal to the reference base frequency minus the reference offset frequency, and when the NAND signal is the selected signal, the oscillator frequency is altered to approach a target frequency equal to the reference base frequency plus the reference offset frequency.

Finally, the frequency tuning applies to any reference base frequencies between 1 and 100 gigahertz, whereas the reference offset frequency is between 1 and 100 megahertz.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

In overview, the present disclosure concerns electronic devices or units, some of which are referred to as communication units, such as cellular phone or two-way radios and the like, typically having a capability for rapidly handling data, such as can be associated with a communication system such as an Enterprise Network, a cellular Radio Access Network, or the like. More particularly, various inventive concepts and principles are embodied in circuits, and methods therein for receiving signals in connection with a communication unit.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with in integrated circuits (ICs), such as a digital signal processor or application specific ICs. It is expected that one of ordinary skill, notwithstanding possibly significant effort and many design choices motivated by, for example, available time, current technology, and economic considerations, when guided by the concepts and principles disclosed herein will be readily capable of generating ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

Figure 1:
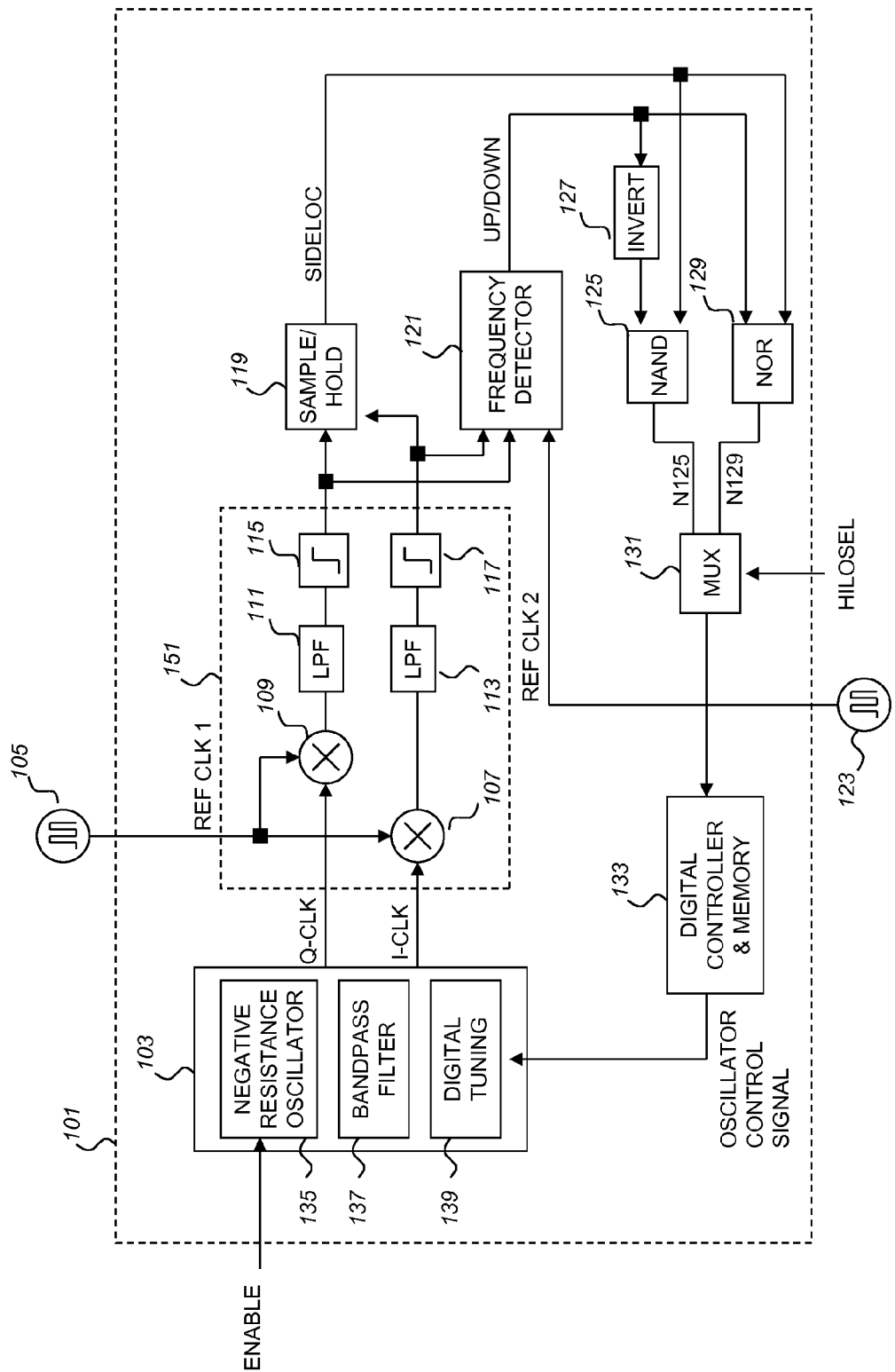
FIG. 1 is a schematic diagram illustrating a exemplary frequency tuning circuit according to disclosed embodiments.

Referring now to FIG. 1, a schematic diagram illustrating an exemplary frequency tuning circuit in accordance with one or more embodiments will be discussed and described. As shown in FIG. 1, the bandpass filter tuning circuit 101 includes a bandpass filter block 103, an RF reference signal source 105, a sample/hold 119, a frequency detector 121, an offset signal source 123, a NAND gate 125, a NOR gate 129, an inverter 127, a multiplexer (MUX) 131, a digital controller and memory 133, and a frequency down-converter 151. The bandpass filter block 103 includes a negative resistance oscillator 135, a bandpass filter 137, and a digital tuning element 139. The frequency down-converter 151 includes first and second mixers 107 and 109, first and second low pass filters (LPF) 111 and 113, and first and second quantizers 115 and 117. An RF reference signal source 105 provides a first reference clock (REF CLK 1) having an RF reference frequency $f_C$, while an offset signal source 123 provides a second reference clock (REF CLK 2) having an reference offset frequency $f_{OFS}$.

As inputs, the bandpass filter tuning circuit 101 receives an enable signal (ENABLE), a high/low select signal (HILOSEL), the first reference clock (REF CLK 1), and the second reference clock (REF CLK 2).

Figure 3:
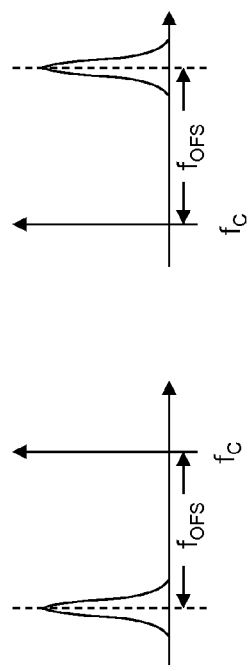
FIG. 3 is a frequency diagram illustrating offset frequencies around the RF frequency.

FIG. 3 illustrates the frequency diagram showing the frequency offset, $f_{OFS}$ with respect to the RF reference frequency, $f_C$. The bandpass filter 137 in the bandpass filter block 103 can be tuned to either an offset that is higher than $f_C$, or an offset lower than $f_C$.

In the frequency tuning mode, the ENABLE signal starts the tuning process. The high/low select signal is used to indicate whether the bandpass filter center frequency is to be tuned above or below $f_C$ by the offset frequency, $f_{OFS}$.

The bandpass filter 137 in the bandpass filter block 103 can be tuned digitally using the digital tuning element 139. In a frequency tuning mode, the ENABLE signal turns the bandpass filter block 103 into an oscillator by powering up the negative resistance oscillator 135.

Tuning the bandpass filter accurately to an offset frequency, $f_{OFS}$, above or below $f_C$ can be done by comparing the difference between the oscillator frequency and $f_C$ to the reference offset frequency, $f_{OFS}$. Generating the frequency difference is done by the frequency down-converter 151. The negative resistance oscillator 135 generates an in-phase clock and a quadrature clock that are separated by ninety degrees, which are each multiplied by the first reference clock REF CLK 1 using the first and second mixers 107 and 109, respectively. By virtue of frequency mixing theory, this multiplication generates a sum and a difference between the oscillator frequency and $f_C$. The first and second lowpass filters 113 and 111 remove the frequency sum components from the outputs of the first and second mixers 107 and 109, respectively; and the first and second quantizers 117 and 115 turn the frequency difference into bi-level in-phase and quadrature offset clocks, respectively.

By down-converting the oscillator clock from $f_C$, only the information about the oscillator offset frequency is generated, but the relative position of the oscillator frequency with respect to $f_C$, either on the higher side or the lower side of the latter, is not available. Recovery of the relative frequency location with respect to $f_C$ is done by having the sample/hold 119 use the offset in-phase clock to sample the offset quadrature clock to generate a side location (SIDELOC) signal. If the oscillator frequency is higher than $f_C$, the SIDELOC signal is set to a logical high; and if the oscillator frequency is lower than $f_C$, the SIDELOC signal is set to a logical low state.

A frequency detector 121 uses the second reference clock REF CLK 2 received from the offset signal source 123 to tune the oscillator offset frequency to the reference offset frequency. The UP/DOWN signal output from the frequency detector 121 is set to logical high if the oscillator offset frequency is lower than $f_{OFS}$. Likewise, UP/DOWN signal is set to logical low if the oscillator offset frequency is higher than $f_{OFS}$.

Figure 4:
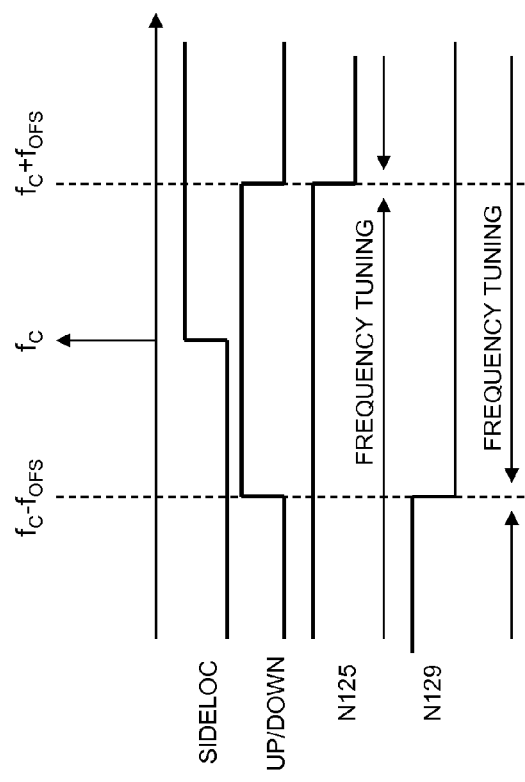
FIG. 4 is a frequency diagram illustrating offset frequency detection.

FIG. 4 illustrates a logic diagram of the signals SIDELOC and UP/DOWN in relation to the location of the oscillator frequency with respect to $f_C$. Note that using the UP/DOWN signal as a frequency feedback control to the negative resistance oscillator 135 is not sufficient due to conflicting feedback control criteria on both low-side and high-side of $f_C$. A logic-high UP/DOWN signal, if fed back to the oscillator, increases the oscillator frequency; whereas the logic-low UP/DOWN signal decreases the oscillator frequency. The inverter 127, the NAND gate 125, the NOR gate 129, and the multiplexer 131 are used to generate the proper frequency feedback control.

The inverter 127 inverts the UP/DOWN signal. The NAND gate 125 performs a logical NAND operation on the inverted UP/DOWN signal and the SIDELOC signal to generate signal N125. The NOR gate 129 performs a logical NOR operation on the UP/DOWN signal and the SIDELOC signal to generate signal N129. FIG. 4 illustrates a logic diagram of signal N125 and signal N129. The multiplexer 131 receives signal N125 and N129 and outputs one based on the HILOSEL signal.

In order to tune to the high-side of $f_C$, the HILOSEL signal instructs the multiplexer 131 to output signal N125. If the oscillator frequency is lower than $f_C$, signal N125 is set at logic high to command increasing the oscillator frequency beyond $f_C$. As the down-converted offset frequency of the oscillator is still lower than $f_{OFS}$, signal N125 remains high to increase the oscillator frequency further till the oscillator frequency offset is equal to $f_{OFS}$.

In order to tune to the low side of $f_C$, the HILOSEL signal instructs the multiplexer 131 to output signal N129. If the oscillator frequency is higher than $f_C$, signal N129, being set at logic low, pulls the oscillator frequency to lower than $f_C$ and continues till the oscillator frequency offset is equal to $f_{OFS}$. The digital controller and memory 133 provides a tuning algorithm to optimize for speed and stability of the frequency locked loop in response to the output of the multiplexer 131 and stores the oscillator tuning code in the memory once the oscillator offset frequency is locked to the reference offset frequency.

Figure 2:
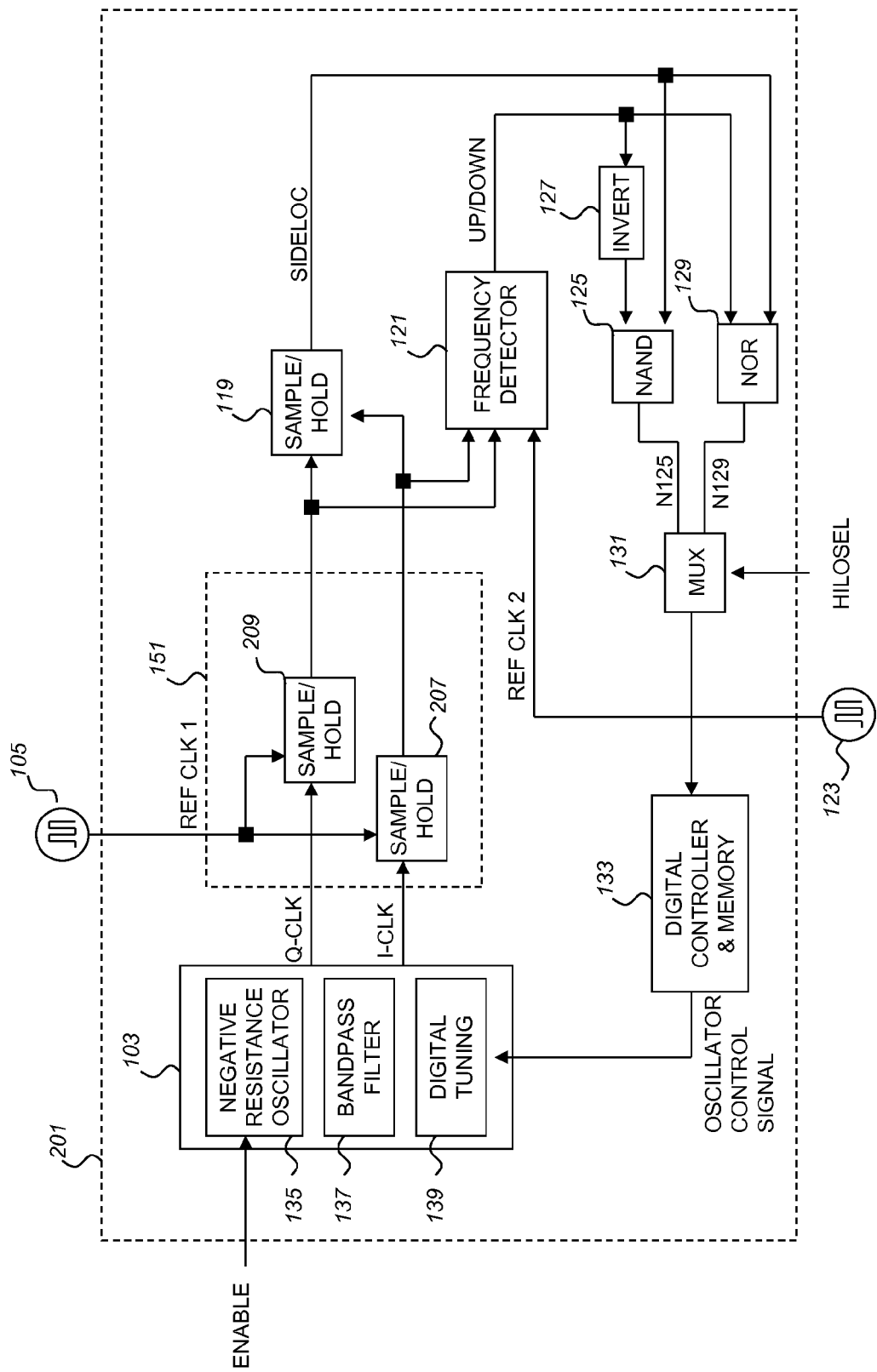
FIG. 2 is a schematic diagram illustrating an alternative frequency tuning circuit, according to disclosed embodiment.

FIG. 2 illustrates an alternative exemplary frequency tuning circuit, wherein the frequency down-converter 151 comprises first and second sample/holds 207 and 209. The oscillator in-phase clock, I-CLK, and quadrature clock, Q-CLK, are sampled by the first reference clock REF CLK 1, with a frequency $f_C$. By virtue of the bandpass sampling theory, the first and second sample/holds 207 and 209 will generate the down-converted in-phase offset clock and quadrature offset clock, respectively.

It should be noted that the term communication unit may be used herein to denote a wired device, for example a high speed modem, an xDSL type modem, a fiber optic transmission device, and the like, and a wireless device, and typically a wireless device that may be used with a public network, for example in accordance with a service agreement, or within a private network such as an enterprise network or an ad hoc network. Examples of such communication devices include a cellular handset or device, television apparatus, personal digital assistants, personal assignment pads, and personal computers equipped for wireless operation, and the like, or equivalents thereof, provided such devices are arranged and constructed for operation in connection with wired or wireless communication.

The communication units of particular interest are those providing or facilitating voice communications services or data or messaging services normally referred to as ultra wideband networks, cellular wide area networks (WANs), such as conventional two way systems and devices, various cellular phone systems including analog and digital cellular, CDMA (code division multiple access) and variants thereof, GSM (Global System for Mobile Communications), GPRS (General Packet Radio System), 2.5G and 3G systems such as UMTS (Universal Mobile Telecommunication Service) systems, Internet Protocol (IP) Wireless Wide Area Networks like 802.16, 802.20 or Flarion, integrated digital enhanced networks, LTE (Long Term Evolution) networks, and variants or evolutions thereof.

Furthermore, the wireless communication devices of interest may have short range wireless communications capability normally referred to as WLAN (wireless local area network) capabilities, such as IEEE 802.11, Bluetooth, WPAN (wireless personal area network) or Hyper-Lan and the like using, for example, CDMA, frequency hopping, OFDM (orthogonal frequency division multiplexing) or TDMA (Time Division Multiple Access) access technologies and one or more of various networking protocols, such as TCP/IP (Transmission Control Protocol/Internet Protocol), UDP/UP (Universal Datagram Protocol/Universal Protocol), IPX/SPX (Inter-Packet Exchange/Sequential Packet Exchange), Net BIOS (Network Basic Input Output System) or other protocol structures. Alternatively the wireless communication devices of interest may be connected to a LAN using protocols such as TCP/IP, UDP/UP, IPX/SPX, or Net BIOS via a hardwired interface such as a cable and/or a connector.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A circuit for tuning a bandpass filter to an offset frequency of an RF frequency, comprising:
   a bandpass filter including a negative resistance oscillator configured to generate an oscillator in-phase clock and an oscillator quadrature clock in response to an oscillator control signal, the oscillator in-phase clock and the oscillator quadrature clock each having an oscillator base frequency;
   an offset frequency converter configured to generate a bi-level in-phase offset clock and a bi-level quadrature offset clock based on the oscillator in-phase clock, the oscillator quadrature clock, and a first reference clock having a reference base frequency, the bi-level in-phase offset clock and the bi-level quadrature offset clock each having an oscillator offset frequency;
   a sample/hold configured to sample and hold the bi-level quadrature offset clock using the bi-level in-phase as a sampling clock to generate a side location signal;
   a frequency detector configured to compare the oscillator offset frequency with a reference offset frequency based on the bi-level in-phase offset clock, the bi-level quadrature offset clock, and a reference offset clock having the reference offset frequency, to generate a direction signal;
   an inverter configured to invert the direction signal;
   a NOR gate configured to perform a logical NOR operation on the side location signal and the direction signal to generate a NOR signal;
   a NAND gate configured to perform a logical NAND operation on the inverted direction signal and the side location signal to generate a NAND signal;
   a multiplexer configured to output either the NOR signal or the NAND signal as a multiplexer output signal based on a selection signal;
   a digital controller and memory circuit configured to generate the oscillator control signal based on the multiplexer output signal.

2. The circuit of claim 1,
   wherein the digital controller and memory is configured such that when the selection signal instructs the multiplexer to output the NOR signal as the multiplexer output signal, the digital controller and memory will generate the oscillator control signal to tune the oscillator frequency to a target frequency equal to the reference base frequency minus the reference offset frequency, and
   wherein the digital controller and memory is configured such that when the selection signal instructs the multiplexer to output the NAND signal as the multiplexer output signal, the digital controller and memory will generate the oscillator control signal to tune the oscillator frequency to a target frequency equal to the reference base frequency plus the reference offset frequency.

3. The circuit of claim 1,
   wherein the reference base frequency is between 1 and 100 gigahertz, and
   wherein the reference offset frequency is between 1 and 100 megahertz.

4. The circuit of claim 1, wherein the frequency offset converter comprises:
   a first mixer configured to mix the oscillator quadrature clock with the reference base clock to generate a first mixed signal;
   a second mixer configured to mix the oscillator in-phase clock with the reference base clock to generate a second mixed signal;
   a first low-pass filter configured to filter the first mixed signal to generate a first filtered signal;
   a second low-pass filter configured to filter the second mixed signal to generate a second filtered signal;
   a first quantizer configured to quantize the first filtered signal to generate the bi-level quadrature offset clock; and
   a second quantizer configured to quantize the second filtered signal to generate the bi-level in-phase offset clock.

5. The circuit of claim 1, wherein the frequency offset converter comprises:
   a first sample/hold configured to sample and hold the oscillator quadrature clock using the first reference clock as a first sampling clock; and
   a second sample/hold configured to sample and hold the oscillator in-phase clock using the first reference clock as a second sampling clock.

6. The circuit of claim 1,
   wherein the first and second filters are low pass filters.

7. A method for tuning a bandpass filter to an offset frequency of an RF frequency, comprising:
   receiving an enable signal to instruct the bandpass filter to operate as an oscillator;
   generating an oscillator in-phase clock and an oscillator quadrature clock, the oscillator in-phase clock and the oscillator quadrature clock each having an oscillator base frequency;
   generating a quadrature offset clock based on the oscillator quadrature clock and a first reference clock having a reference base frequency;
   generating an in-phase offset clock based on the in-phase clock and the first reference clock;
   generating a logical side-location signal based on the in-phase offset clock and the quadrature offset clock;
   generating a direction signal based on the in-phase offset clock, the quadrature offset clock, and a frequency offset clock having a reference offset frequency;
   inverting the direction signal;
   generating a NOR signal by performing a logical NOR operation on the side-location signal; and the direction signal;
   generating a NAND signal by performing a logical NAND operation on the side-location signal and the inverted direction signal;
   selecting one of the NAND signal and the NOR signal as a selected signal based on a side-select signal;
   generating a feedback frequency control signal based on the selected signal; and
   altering the oscillator frequency based on the feedback frequency control signal.

8. The method of claim 7, wherein generating the in-phase offset clock comprises:
    mixing the oscillator in-phase signal with the first reference clock to generate an in-phase mixing signal;
    performing a low-pass filtering operation on the in-phase mixing signal to generate an in-phase baseband signal; and
    quantizing the in-phase baseband signal to generate the in-phase offset clock.

9. The method of claim 7, wherein generating the in-phase offset clock comprises:
    sampling and holding the oscillator in-phase clock using the first reference clock as a sampling clock to generate the in-phase offset clock.

10. The method of claim 7, wherein generating the quadrature offset clock comprises:
    mixing the oscillator quadrature signal with the first reference clock to generate a quadrature mixing signal;
    performing a low-pass filtering operation on the quadrature mixing signal to generate a quadrature baseband signal; and
    quantizing the quadrature baseband signal to generate the quadrature offset clock.

11. The method of claim 7, wherein generating the quadrature offset clock comprises:
    sampling and holding the oscillator quadrature clock using the first reference clock as a sampling clock to generate the quadrature offset clock.

12. The method of claim 7,
    wherein generating the logical side-location signal based on the in-phase offset clock and the quadrature offset clock further comprises sampling the quadrature offset clock using the in-phase offset clock as a sampling clock.

13. The method of claim 7,
    wherein when the NOR signal is the selected signal, the oscillator frequency is altered to approach a target frequency equal to the reference base frequency minus the reference offset frequency, and
    wherein when the NAND signal is the selected signal, the oscillator frequency is altered to approach a target frequency equal to the reference base frequency plus the reference offset frequency.

14. The method of claim 7,
    wherein the reference base frequency is between 1 and 100 gigahertz, and
    wherein the reference offset frequency is between 1 and 100 megahertz.

* * * * *